United States Patent [19]

Lofter

[11] Patent Number: 4,668,923
[45] Date of Patent: May 26, 1987

[54] PHASE LOCKED LOOP FOR LOCKING AN OSCILLATOR TO A NONINTEGER MULTIPLE OF THE REFERENCE FREQUENCY

[75] Inventor: Björn O. Lofter, Mölndal, Sweden
[73] Assignee: Telefonaktiebolaget LM Ericsson, Stockholm, Sweden
[21] Appl. No.: 833,724
[22] Filed: Feb. 26, 1986
[30] Foreign Application Priority Data
  Apr. 12, 1985 [SE] Sweden .................... 8501803
[51] Int. Cl.⁴ .......................................... H03L 7/16
[52] U.S. Cl. .................................... 331/16; 331/18; 331/25
[58] Field of Search ............... 331/1 A, 14, 16, 18, 331/25

[56] References Cited
U.S. PATENT DOCUMENTS
  3,353,104 11/1967 Loposer .................... 331/25 X
  4,442,412 4/1984 Smith et al. ................ 331/1 A Primary Examiner—Siegfried H. Grimm
Attorney, Agent, or Firm—Roberts, Spiecens & Cohen

[57] ABSTRACT

A method and apparatus for phase locking the signal of a controlled oscillator (1) to that of a reference oscillator (3), a correction quantity depending on the difference between the relative phase angles of the signals being generated at correction instants for correcting the frequency of the controlled oscillator. According to the invention, the phase lock may also be achieved with a controlled oscillator (1), having a frequency which is not a whole number multiple of the reference oscillator (3) frequency by, in one embodiment, the reference oscillator signal or in another embodiment, the controlled oscillator signal being phase shifted such that the phase difference occurring at the correction instants as a result of the controlled oscillator frequency not being a non-integer multiple of the reference oscillator frequency is eliminated at the formation of the correction quantity.

7 Claims, 6 Drawing Figures

PHASE LOCKED LOOP FOR LOCKING AN OSCILLATOR TO A NONINTEGER MULTIPLE OF THE REFERENCE FREQUENCY

TECHNICAL FIELD

The invention relates to a method and apparatus for locking the signal of a controlled oscillator to that of a reference oscillator by a correction quantity depending on the difference between the relative phase angles of the signals being generated at correction instants for correcting the frequency of the controlled oscillator.

BACKGROUND ART

An apparatus of the kind given above is described in Proc. 34th Ann. Freq. Control Symposium, USAERDCOM, Ft. Monmouth, N.J. 07703, May 1980, pp. 202–212 (see particularly FIG. 10 with pertaining text).

Such an apparatus is also shown in the appended FIG. 1. A voltage controlled oscillator is denoted by the numeral 1, and its frequency is roughly set by a voltage source 2 which, in response to the selected frequency of the oscillator, generates one of a plurality of different voltages. The frequency is finely adjusted by a correction voltage formed by the oscillator output signal being phase locked to the signal from a reference oscillator 3. The latter being connected to a phase angle-sensing means or phase angle sensor 4 disposed to send on its output a control signal in the form of a short pulse, each time the phase angle of a signal at its input is equal to a given value, e.g. zero. A comparison means or comparator 5 in the form of an interacting and holding circuit is activated when the short pulse occurs. The means 5 then senses the output signal of the voltage controlled oscillator and conventionally generates a correction voltage which, via a low pass amplifier means 6 containing an amplifier and a lowpass filter is supplied to the voltage controlled oscillator 1 for correcting its frequency.

An example of the signals' variations in time at the points a–c is illustrated by the diagram of FIG. 2. The graphs 2a, 2b, and 2c respectively represent the signal from the reference oscillator 3, the short pulses from the phase angle sensing means 4, and the signal from the voltage controlled oscillator 1. In the example the frequency of the controlled oscillator is 4 times as great as that of the reference oscillator.

In the illustrated apparatus of the prior art, only signals having frequencies constituting whole number or integer multiples of the reference oscillator frequency may be phase locked to the signal from it. The frequency spacing between frequencies which may be phase locked is thus equal to the reference oscillator frequency. However, in a radar system, for example, there is often required a larger number of frequencies in a given frequency band than can be obtained from this apparatus. The number of phase lockable frequencies can indeed be increased if the reference oscillator frequency is reduced. This means accordingly that the sampling rate is decreased and that the amount of multiplication must be increased. These changes result in that the generated signal is deteriorated due to socalled phase noise. Another conceivable possibility of increasing the number of available frequencies is to change between different mutually frequency shifted reference oscillators on changing frequency. This causes leakage problems, however, between different oscillator signals as well as high costs for oscillators and switches.

DISCLOSURE OF INVENTION

An object of the present invention is to provide a method and apparatus of the kind given in the introduction, where phase locking of a signal, the frequency of which is a non-integer multiple of the reference signal, is possible. This is achieved by a suitably selected phase shift of the signal from the reference oscillator or the controlled oscillator before the correction quantity is generated. A frequency generator with an apparatus in accordance with the invention can in principle supply an optional number of phase locked frequencies within a given frequency band and will furthermore be comparatively small, light and inexpensive. The distinguishing features of the invention are disclosed in the claims.

BRIEF DESCRIPTION OF DRAWINGS

The invention will now be described in detail with reference to the accompanying drawings, on which.

BEST MODE FOR CARRYING OUT THE INVENTION

Figure 1:
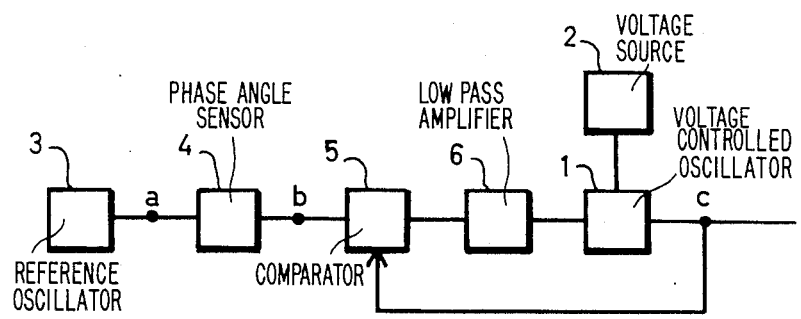
FIG. 1 illustrates prior art apparatus for phase locking the signal from a controlled oscillator to the signal from a reference oscillator.
Figure 2:
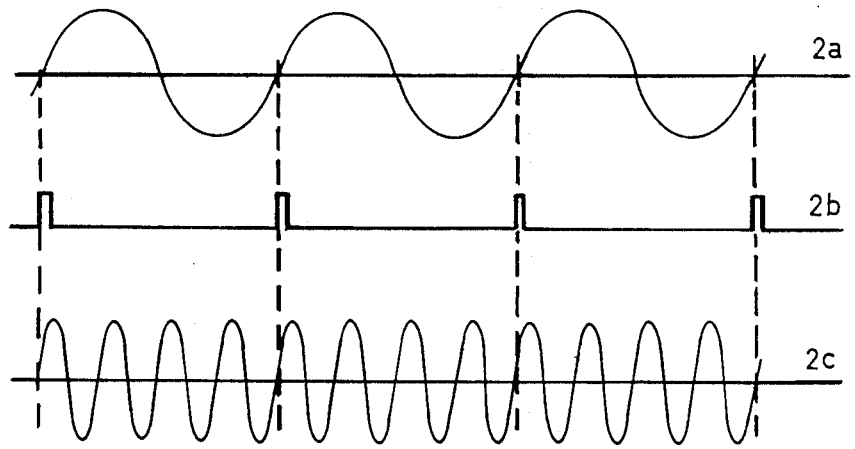
FIG. 2 is a set of graphs or waveforms illustrating the signals at certain points in the apparatus according to FIG. 1.
Figure 3:
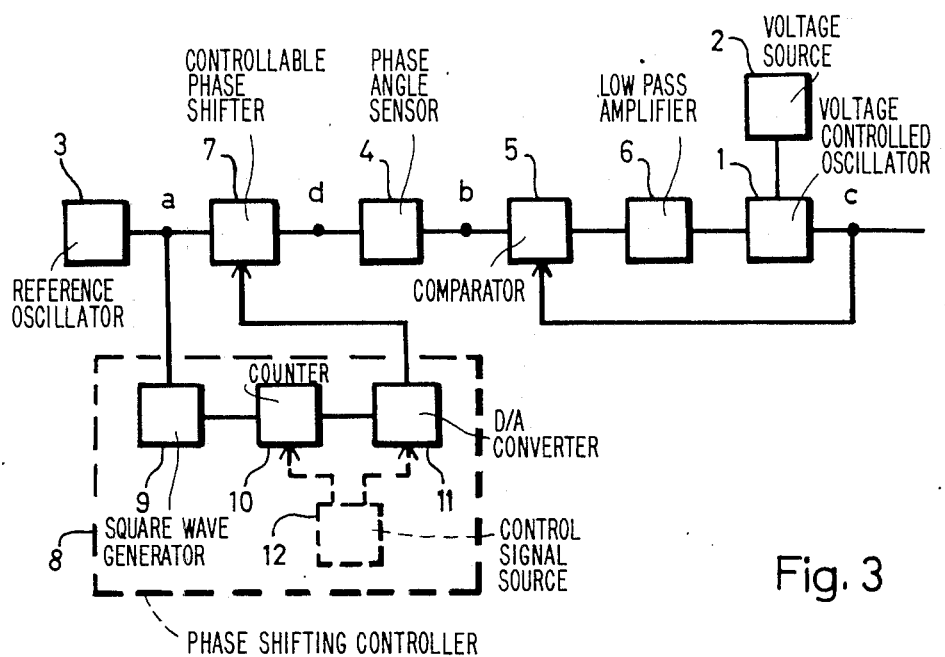
FIG. 3 illustrates a first embodiment of an apparatus in accordance with the invention.

A first embodiment of an apparatus in accordance with the invention is illustrated in FIG. 3, the means having correspondence to those in FIG. 1 being denoted with the same reference characters as in FIG. 1. A controllable, phase shifting means or controllable phase shifter 7 is connected between the reference oscillator 3 and the phase angle-sensing means 4. The means 7 phase shifts the reference oscillator signal in response to a control signal from a phase shifting control means or phase shifting controller 8. In the latter the reference oscillator signal is sensed by a square wave generator 9, which generates a square wave signal whose voltage is high when the voltage at its input is greater than zero and vice versa. A counter 10, which is adapted for counting to a setable maximum value and thereafter to start a new counting cycle, is connected to the output of the square wave generator 9 to count the waning flanks or trailing edges of the square wave signal. With the numeral 11 there is denoted a digital-analogue converter or D/A converter with setable gain, i.e. such a converter where the input voltage for a given digital input value, e.g. the maximum for the converter may be used to agree with a desired value by an outside adjustment of the converter. This converter may, of course, be replaced by a non-setable converter followed by a controllable amplifier. The control input of the phase shifting means 7 is supplied by the digital-analogue converter 11 with a signal depending on the count value and set gain. The means 8 may also contain a control signal source 12, supplying setting values to the respective control inputs of the counter 10 and digital-analogue converter 11 for respectively setting the maximum count value of the counter and the gain of the digital-analogue converter. The function of the means 12 will be described in detail below. By controlling the phase shift of the reference oscillator signal in a suitable way, each pulse generated by the phase angle-sensing means 4 may be caused to occur at least practically simultaneously as the phase angle of the controlled oscillator singal is zero, even when the frequency of the latter is not an integer multiple of the reference oscillator frequency. The unavoidable phase difference occurring between the reference oscillator signal and the controlled oscillator signal occurring at a given phase angle (suitably zero), and which is due to the frequency of the controlled oscillator not being a whole number integer multiple of the reference oscillator frequency, may be compensated by this phase shift. Accordingly, signals having frequencies not being whole number multiples of the reference oscillator frequency may thus be phase locked to the signal from it.

Figure 4:
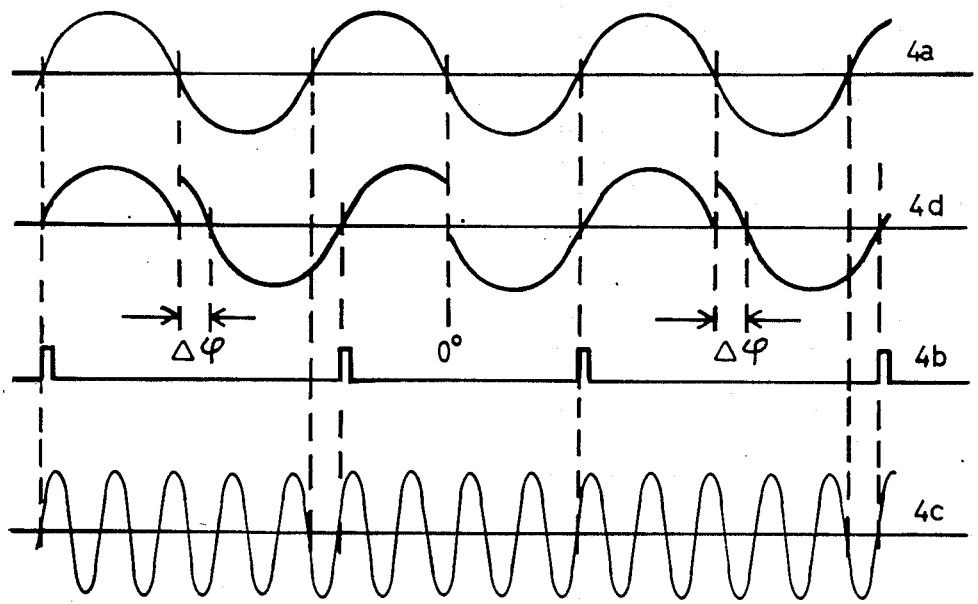
FIG. 4 is a set of graphs illustrating the signals at given points in the apparatus according to FIG. 3.

An example of the signals at the points a–d in the apparatus according to FIG. 3 is illustrated in FIG. 4. Here the frequency of the control oscillator 1 is 4.5 times greater than the reference oscillator frequency. To enable locking, alternate periods of the refernece oscillator signal are phase shifted an angle $\Delta\rho$, corresponding to a half period of the controlled oscillator signal. Without this phase shift alternate pulses from the phase angle-sensing means 4 would have been generated when the controlled oscillator signal is 180° phase-shifted in relation to the zero angle, and phase locking would not have been possible. However, due to the phase shift each pulse from the phase sensing means 4 will occur simultaneously, or at least practically simultaneously as the phase angle of the signal from the controlled oscillator 3 is zero. To achieve this, the maximum count value of the counter 10 is set to 2 in the example, and it can thus only generate two different counts. The gain of the digital-analogue converter 11 which, together with the varying count, determines the size of the phase shift, is simultaneously set so that the converter generates a control signal which does not achieve any phase shift when it obtains one of the counts; and when it obtains the other count it generates a control signal achieving the phase shift $\Delta\rho$ illustrated in FIG. 4. Since the counter 10 counts the waning flanks of the signal from the square wave generator 9, and these occur when the reference oscillator signal changes value from positive to negative, the phase shifts occur simultaneously as these changes occur, which is also illustrated in the Figure. For a frequency relationship which is 35.5, corresponding to a more realistic example than the one shown, $\Delta\rho$ is approximately 5 degrees. If the maximum count on the counter 10 is set at 2 as in the example above, there is in principle enabled phase locking of every other signal, the frequency of which is $(N+\frac{1}{2})$ times as great as the reference oscillator frequency, where N is an integer or whole number. The gain of the digital-analogue converter 11 must be adjusted to the selected frequency, however, such that the angle by which alternate periods of the reference oscillator signal is phase shifted is as great as the unavoidable and frequency-dependent phase difference which occurs, e.g. for a phase angle equal to zero, in this signal, in relation to the control oscillator signal as a result of their frequencies not being whole number multiples of each other.

By altering the maximum count of the counter 10 in response to the selected frequency of the controlled oscillator 1, each signal having a frequency greater than the reference signal frequency can in principle be phase locked to the reference signal. A condition for this is that the gain of the digital-analogue converter 11 is also adjusted to the selected frequency, so that the size of the phase shift for each period of the reference oscillator signal corresponds to the above-mentioned unavoidable and frequency-dependent phase difference. If the maximum count is put equal to 4, for example, phase locking of signals having frequencies which are $(N+\frac{1}{4})$ or $(N+\frac{3}{4})$ times as large as the reference oscillator frequency is enabled. This is because the accumulated period times for 4 periods of the reference oscillator signal exactly correspond to the accumulated period times for a whole number ($4N+1$ and $4N+3$) periods of the controlled oscillator signal. In these cases the gain of the converter 11 must be selected so that the size of the phase shift for the four different counts of the counter 10 correspond to 90, 180, 270 and 0 degrees in the controlled oscillator signal, which corresponds, for a frequency relationship of about 35, to approximately 2.5, 5.0, 7.5 and 0 degrees in the reference oscillator signal.

The maximum count settings of the counter 10 mentioned above, and the gain on the digital-analogue converter 11 can be done manually on the components. This is also conceivable to arrange so that the optionally installed control signal source 12 is adjusted automatically to the values necessary for a given selected frequency simultaneously with the setting of the voltage source 2. The apparatus according to FIG. 3 is based on the concept that the unavoidable phase difference between the reference oscillator signal and the controlled oscillator signal is compensated by phase shifting the reference oscillator signal, so that the pulses from the phase angle-sensing means 4 will be generated when the controlled oscillator signal is at least practically at a given phase angle (zero).

Figure 5:
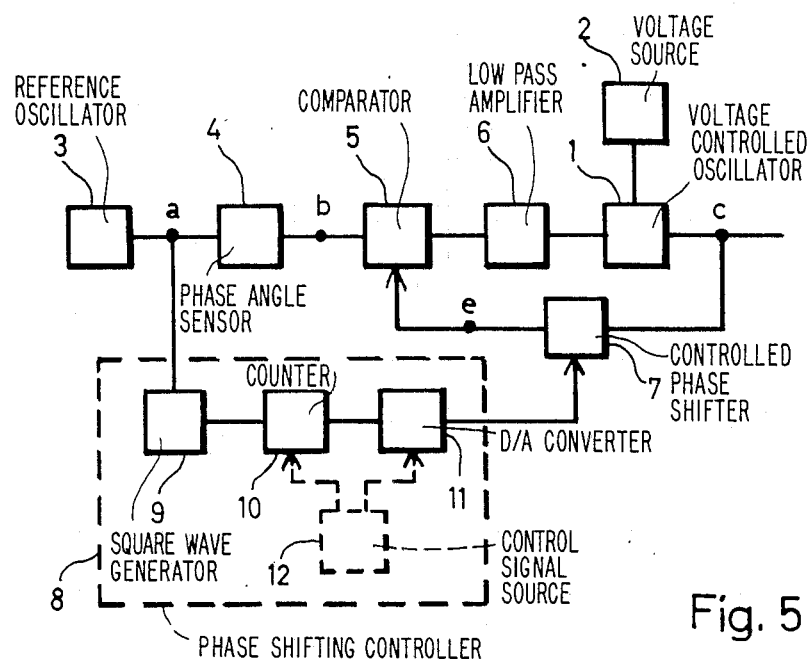
FIG. 5 illustrates a second embodiment of an apparatus in accordance with the invention.

An apparatus is illustrated in FIG. 5 where the controlled oscillator signal is instead phase shifted to compensate for the unavoidable phase difference between both signals. All the means have their counterparts and therefore the same denotations as in FIG. 3. The apparatus according to FIG. 5 differs from the apparatus according to FIG. 3 only in that the controllable phase shifting means 7 is connected between the output of the controlled oscillator 1 and the comparison means 5 instead of between the reference oscillator 3 and the phase angle-sensing means 4.

Figure 6:
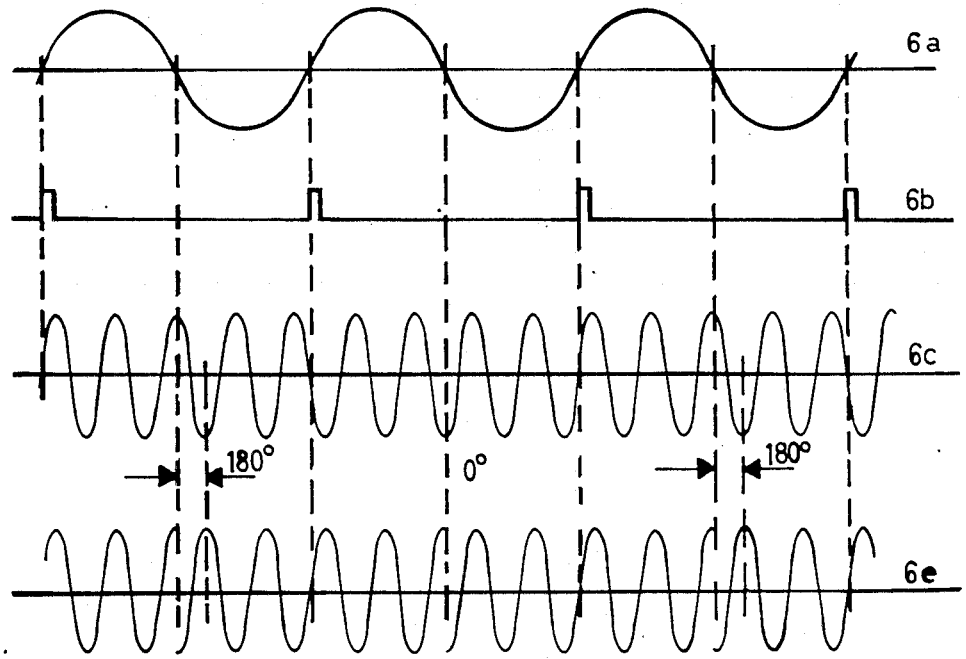
FIG. 6 is a set of graphs or waveforms illustrating the signals at certain points in the apparatus according to FIG. 5.

In FIG. 6 there is an example of the signals at the points a, b, c, and e in the apparatus according to FIG. 5, the frequency of the controlled oscillator being 4.5 times as great as the reference oscillator frequency, as in the example according to FIG. 4. The maximum count of the counter 10 is thus set to 2 and the gain of the digital-analogue converter is set so that the phase shift alternates between zero and 180° degrees.

As with the apparatus according to FIG. 3, it is also possible in principle to achieve phase locking of each such frequency which is greater than the reference oscillator frequency by suitable adjustement of the maximum count on the counter 10 and of the gain of the digital-analogue converter 11 to the selected frequency.

What is claimed is:

1. Method of locking the frequency of a voltage controlled oscillator in a phase locked loop to a rational number multiple of the frequency of a reference oscillator wherein the rational number consists of a positive integer and a fraction comprising the steps of providing a signal from the reference oscillator having a reference frequency, providing an output signal from the voltage controlled oscillator having a frequency approaching the multiple of the frequency of the reference oscillator, phase shifting one of said signals by an amount related to the fractional part of the rational number, phase comparing the phase shifted signal with the non-phase shifted signal to provide a control signal, and utilizing said control signal to change the frequency of the output signal in a direction and by an amount for minimizing the amplitude of said control signal.

2. Phase locked loop oscillator system comprising a reference oscillator means for generating a reference signal of a given frequency, voltage controlled oscillator means for generating an output signal having a frequency controllably variably about a frequency which is a rational number multiple of said given frequency wherein said rational number consists of a positive integer and a fraction, phase shift means for shifting one of said signals by an amount related to the fractional part of the rational number, phase comparator means comparing the phase of the phase-shifted signal with the phase of the non phase-shifted signal to generate a control voltage having an amplitude related to the amplitude of the phase difference and feeding means for feeding the control voltage to said voltage controlled oscillator means.

3. The system of claim 2 wherein said phase shift means is connected between said reference oscillator means and said phase comparator means for phase shifting the reference signal.

4. The system of claim 2 wherein said phase shift means is connected between said voltage controlled oscillator means and said phase comparator means for phase shifting the output signal.

5. The system of claim 2 wherein said phase shift means comprises a voltage controlled phase shifter and a phase shifting controller connected thereto.

6. The system of claim 5 wherein said phase shifting controller comprises a modulo-n counter for counting periods of the reference signal wherein n is an integer related to the locking frequency and a digital-to-analog converter means for converting the digital count accumulated in said counter to another control voltage having an amplitude related to the digital count and means for applying said other control voltage to said controlled phase shifter.

7. The system of claim 6 wherein the value n is controllably changeable and the gain of the digital-to-analog converter is controllably adjustable to facilitate providing the phase shift necessary for the frequency selected for the voltage controlled oscillator means.

* * * * *